(12) United States Patent
Demir et al.

(10) Patent No.: US 6,846,740 B2
(45) Date of Patent: Jan. 25, 2005

(54) WAFER-LEVEL QUASI-PLANARIZATION AND PASSIVATION FOR MULTI-HEIGHT STRUCTURES

(75) Inventors: Hilmi Volkan Demir, Stanford, CA (US); Onur Fidaner, Stanford, CA (US); David Andrew Barclay Miller, Stanford, CA (US); Vijit Sabnis, Menlo Park, CA (US); Jun-Fei Zheng, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 10/460,880

(22) Filed: Jun. 14, 2003

(65) Prior Publication Data

US 2004/0253808 A1 Dec. 16, 2004

(51) Int. Cl.[7] ............... H01L 21/4763; H01L 21/44; H01L 21/3202; H01L 21/336
(52) U.S. Cl. ............... 438/633; 438/618; 438/666; 438/671; 438/197; 438/585
(58) Field of Search ............... 438/633, 618, 438/666, 671, 669, 697, 197, 585, 587

(56) References Cited

U.S. PATENT DOCUMENTS

| | | | | |
|---|---|---|---|---|
| 4,759,821 A | * | 7/1988 | Knoedler et al. | 438/579 |
| 4,859,633 A | * | 8/1989 | Bayraktaroglu | 438/128 |
| 4,933,994 A | * | 6/1990 | Orban | 438/232 |
| 5,001,079 A | * | 3/1991 | van Laarhoven et al. | 438/666 |
| 5,272,100 A | * | 12/1993 | Satoh et al. | 438/305 |
| 5,310,700 A | * | 5/1994 | Lien et al. | 438/618 |
| 5,559,049 A | * | 9/1996 | Cho | 438/304 |
| 5,559,055 A | * | 9/1996 | Chang et al. | 438/586 |
| 5,741,736 A | * | 4/1998 | Orlowski et al. | 438/286 |
| 5,959,337 A | * | 9/1999 | Gardner et al. | 257/410 |
| 6,071,805 A | * | 6/2000 | Liu | 438/619 |
| 6,468,852 B1 | * | 10/2002 | Gonzalez et al. | 438/217 |
| 6,638,867 B2 | * | 10/2003 | Liu et al. | 438/692 |
| 6,642,112 B1 | * | 11/2003 | Lowe et al. | 438/275 |
| 2002/0001914 A1 | * | 1/2002 | Lee | 438/401 |
| 2003/0203560 A1 | * | 10/2003 | Ryu et al. | 438/218 |

* cited by examiner

*Primary Examiner*—Matthew Smith
*Assistant Examiner*—Choung Anh Luu
(74) *Attorney, Agent, or Firm*—Schwabe, Williamson & Wyatt, P.C.

(57) ABSTRACT

Methods in accordance with the present invention provide a quasi-planarized surface between one or more semiconductor devices and at least a portion of surrounding passivation material, where the devices have different elevations above a substrate. A hard mask defines the planarized surface as the interface between the hard mask and both the passivation layer and the device, after a passivation layer etching process. The resulting planarized surface has a small to zero step height, is insensitive to passivation layer non-uniformity and etch non-uniformity, provides full passivation of the device side wall, provides protection for the device against etch-induced damage, and prevents the detrimental effects of passivation layer voids. The methods are applicable to semiconductor device fabrication for electronic and photonic/optoelectronic systems such as, but not limited to, cell phones, networking systems, high brightness (HB) LEDs, laser diodes (LDs), photodiodes, modulator diodes and multifunction solar cells.

20 Claims, 7 Drawing Sheets

WAFER-LEVEL QUASI-PLANARIZATION AND PASSIVATION FOR MULTI-HEIGHT STRUCTURES

FIELD OF THE INVENTION

The present invention relates to semiconductor device fabrication and, more particularly, to fabrication methods involving the passivation and quasi-planarization of integrated devices comprising multiple semiconducting devices having device surfaces at different elevations to a substrate.

BACKGROUND OF INVENTION

Semiconductor components, such as components for optoelectronic applications, frequently use layered heterostructures of semiconductor materials (e.g. PIN junction or multi-quantum wells) where semiconductor devices are mostly built from layer upon layer in the vertical direction on a substrate. The layers are selectively deposited and selectively removed using various deposition and material removing processes. These layers can be on the order of nanometers to micrometers in thickness. The methods are used to create microelectronic semiconductor devices, such as diodes and transistors, on the substrate.

Device processing takes primarily one of two technologies. One technology incorporates a process wherein the substrate goes through a variety of masking and etching steps. The second technology incorporates a process known as epitaxy wherein the semiconductor devices are grown atomic layer by atomic layer by a process such as chemical vapor deposition. Either technology singularly, or in combination, can be used to build complex integrated devices having three-dimensional structures.

In the course of fabrication, whether the discrete devices are formed by epitaxy or mask/etch, some processing steps leave an exposed device side wall. These side walls form conductive oxide layers in some material systems, such as, but not limited to, InP and InGaAsP. The side wall is subsequently passivated so that no leakage current will exist between individual material layers forming the semiconductor device, and/or between the layer above to the layer below the semiconductor device. Commonly, passivation is achieved by the application of a passivation material, such as, but not limited to, BCB polymer and PMMA photoresist, that is spun around and over the device to encapsulate the side wall.

After the passivation layer is formed, the surface of the passivation layer is planarized with the top of the device. Planarizing is required, for example, such that a high definition metallization layer may be formed across the surface to effect electrical interconnection with other devices or components.

Figure 16A:
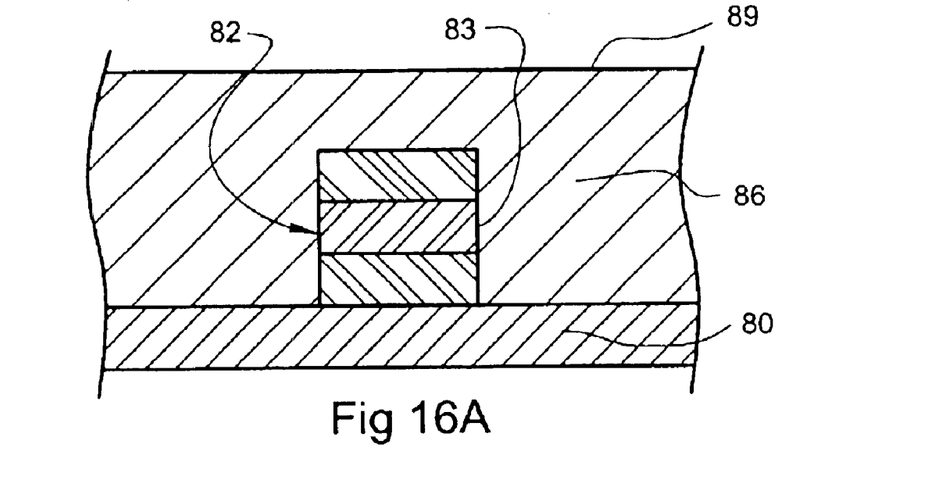
FIG. 16A is a cross-sectional view showing a conforming passivation layer encasing a semiconductor device.
Figure 16B:
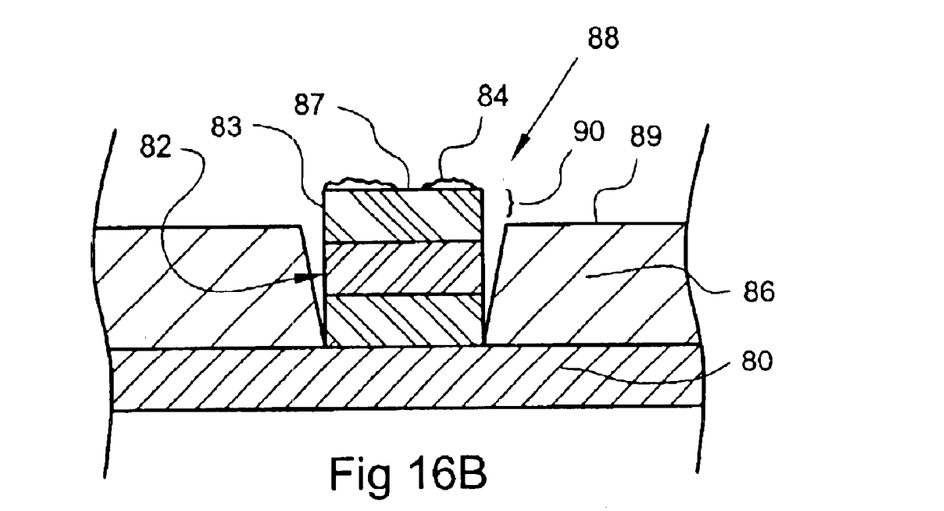
FIG. 16B is a cross-sectional view showing the passivation layer after an etching process was used to lower the passivation layer surface to substantially flush with the device surface.

One method of planarization is by use of a chemical etching process that etches the surface of the passivation layer to a level flush with the top surface of the device; a process known as etch-back. Planarization using a chemical etching process is not without complications. FIG. 16A is a cross-sectional view showing a conforming passivation layer 86 encasing a multi-layer semiconductor device 82. The passivation layer 86 conforms to the device side wall 83. FIG. 16B is a cross-sectional view showing the passivation layer 86 after an etching process was used to lower the passivation layer surface 89 to substantially flush with the device surface 87.

A common problem with the etching of a surface containing two materials is known as trenching. Trenching is found at the interface of the two materials where enhanced etching can occur. The enhanced etching at the material interface forms a trench 88, as shown in FIG. 16B. The trench 88 can extend from the passivation layer surface 89 to the next material layer or to the substrate 80 adjacent the device side wall 83. This trenching can, in some cases, allow the exposed device side wall 83 to form a conductive oxide layer. Subsequent formation of a metallization layer on the device surface 87 and the passivation layer surface 89 can result in the unpassivated device side wall 83 being coated with the metallization material causing an interlayer electrical short.

The transition between the passivation layer surface 89 and the device surface 87 must be within an acceptable step height 90. In many cases, the acceptable step height 90 is defined, for a multi-layer semiconductor device 82, to be somewhat smaller than the thickness of the top layer defining the device surface 87 in order to prevent shorting between the adjacent device layer.

In some instances, the passivation layer 86 will contain micro defects (not shown), such as gas bubbles or voids. As the passivation layer 86 is etched back, any exposed voids will grow, possibly extending from the passivation layer surface 89 to the device side wall 83. This can also cause interlayer electrical shorting.

In some instances, a residue layer 84 of passivation material remains on the device surface 87 after the etching of the passivation layer 86. This residue layer 84 can remain for a number of reasons, such as, but not limited to, particle contamination masking the removal of the passivation layer 86, and carbonized passivation material caused by etching processes that is resistant to etch removal, among others. This residue layer 84 is detrimental to the quality of the interconnection between the device surface 87 and other devices.

The above passivation and planarization issues are compounded for complex integrated devices that have multiple devices having surfaces at different elevations above the substrate. This can be the result of varying process control in the growth or etch process used to produce the devices, such as to impart a desired functionality by adding to or etching from one or more devices. The surface of the integrated device must be quasi-planarized; that is, the integrated device surface will comprise multiple localized planarized surfaces corresponding to the multiple device elevations. In one fabrication technique, the devices are passivated and planarized at each common elevation in turn, from lowest to highest elevation, requiring a number of processing steps for each device elevation. This process is complex, time consuming, and has the potential for increased defect rates.

New methods are needed for the passivation and quasi-planarization of integrated devices having multiple device surfaces at multiple elevations above the substrate. The methods would preferably provide a small to zero step height, be relatively insensitive to passivation layer non-uniformity and etch non-uniformity, provide acceptable passivation of the device side wall, provide protection for the device against etch-induced damage, ensure a residue-free device surface, and/or prevent the detrimental effects of passivation layer voids. The methods preferably also have a low defect rate, impart little to no harm to the underlying desired material layers, and/or be reasonably economical.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

The following embodiments, in accordance with the methods of the present invention, are described as applied to the fabrication of compound semiconductor devices. This is but one example of a class of devices that can benefit from the present invention. The present invention is suitable for a wide variety of material processing, including, but not limited to, Indium Phosphide and other compound semiconductor-based materials, and silicon, and is not to be limited by the included examples. The present invention is particularly useful where a quasi-planarized multi-material surface is required.

In the following description, the term "device" is used to identify the discrete layer or layers of material that is or will be surrounded by passivation material. The device, individually and in combination, can take many forms, such as, but not limited to, diode, transistor, and FET, including electronic and optoelectronic devices. The embodiments of the present invention may be practiced for many applications requiring planarization between two or more materials, and therefore, the present invention is not to be limited to the devices and/or materials described by way of example.

Compound semiconductor-based devices are used in a wide variety of electronic and photonic systems. Various elements are combined to become compound semiconductors. The most common elemental combinations come from the Group III and Group V elements, although II–VIs and some from the Group IVs are also considered. These combinations include Gallium (Ga) and Arsenic (As) to form Gallium Arsenide (GaAs), Indium (In) and Phosphorus (P) to form Indium Phosphide (InP), Silicon (Si) and Carbon (C) to form Silicon Carbide (SiC), and Gallium and Nitrogen to form Gallium Nitride (GaN). Often, more than two elements are combined, such as with Aluminum (Al) to form alloys including AlGaP and AlGaN, as well as InGaAsP and InGaAsN.

Whether silicon or compound semiconductors, the substrate, also known as a wafer, is typically sliced and polished to form the thin starting substrate upon which the ultimate electronic or photonic devices are fabricated.

FIGS. 1 through 13 illustrate side cross-sectional views of the result at various stages of the fabrication of a semiconductor device using mask and etch techniques in accordance with embodiments of the methods of the present invention. The mask and etch techniques are shown by way of example and are not limited thereto, as other technologies may be used to fabricate the semiconductor devices with similar features and characteristics. The figures illustrate idealized structures having straight edges and sharp corners. It is understood and appreciated that the resulting structures formed by embodiments of methods of the present invention, and in particular those structures formed using etching processes, will deviate from the idealized illustrations in ways, such as, but not limited to, non-straight edges and rounded corners.

FIGS. 1–6 illustrate side cross-sectional views of the result at various stages of the fabrication of a single semiconductor device to the stage prior to device passivation. A single semiconductor device is illustrated in order to describe mask and etch techniques as practiced to produce a single semiconductor device. It is understood that the techniques may be practiced wherein there are multiple devices as the same elevation and/or at different elevations, as will be described below. Additional mask and etch processes may be used to produce multiple semiconductor devices with top surfaces at multiple elevations to the substrate. Epitaxial techniques, and combinations of epitaxial and mask and etch techniques, may also be used.

Figure 1:
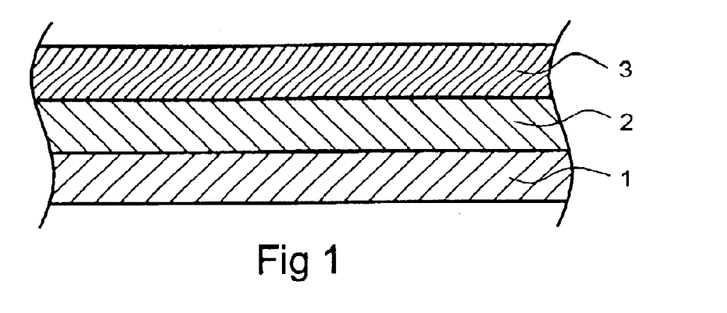
FIG. 1 is a cross-sectional view of a substrate, a conformal device layer, and a conformal hard mask layer, in accordance with an embodiment of the method of the present invention.

FIG. 1 is a cross-sectional view of a substrate 1, a conformal device layer 2, and a conformal hard mask layer 3 thereon. The device layer 2 comprises semiconductor material that will form the desired semiconductor device. The device layer 2 may be a single layer of one material, such as, but not limited to, InP, or comprise multiple material layers, such as, but not limited to, InP/InGaAsP multi-quantum wells/InP. The hard mask layer 3 is a material that has predetermined etching characteristics resistant to the etching processes used to define the device layer and remove the passivation layer as described below. The hard mask layer 3 comprises a material, such as, but not limited to, silicon dioxide (SiO2), silicon nitride (Si3N4), and metals.

Figure 2:
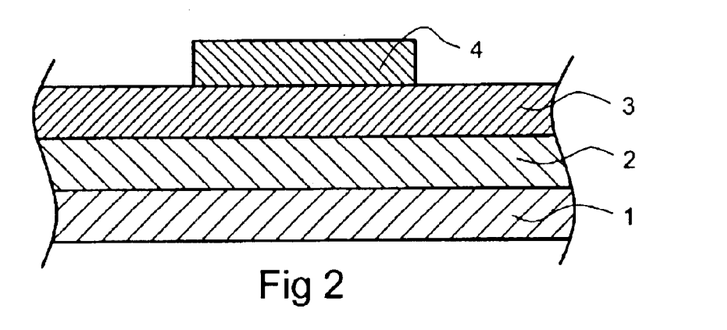
FIG. 2 is a cross-sectional view of a resist mask formed upon the hard mask layer, in accordance with an embodiment of the method of the present invention.

FIG. 2 is a cross-sectional view of a resist mask 4 farmed upon the hard mask layer 3. The method in which the resist mask 4 is formed is well known using methods, such as, but not limited to, photolithographic techniques.

Figure 3:
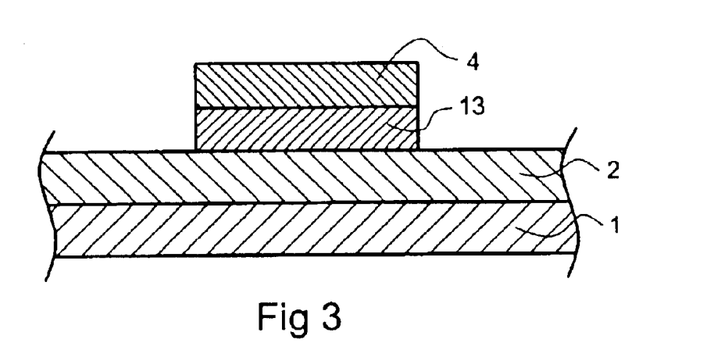
FIG. 3 is a cross-sectional view showing the hard mask layer and the resist mask after an etching process, in accordance with an embodiment of the method of the present invention.

FIG. 3 is a cross-sectional view showing the hard mask layer 3 and the resist mask 4 after an appropriate etching process. The resist mask 4 is used to pattern the hard mask layer 3 to define a hard mask 13. The etching process removes the hard mask layer 3 that is not protected by the resist mask 4 to expose corresponding portions of the underlying device layer 2. Suitable etching processes, by way of example and not limited thereto, wherein the hard mask layer comprises SiO2, includes a wet etching process using buffered hydrofluoric acid (BHF) and a plasma etching process using C2F6+CHF3+O2, among others.

Figure 4:
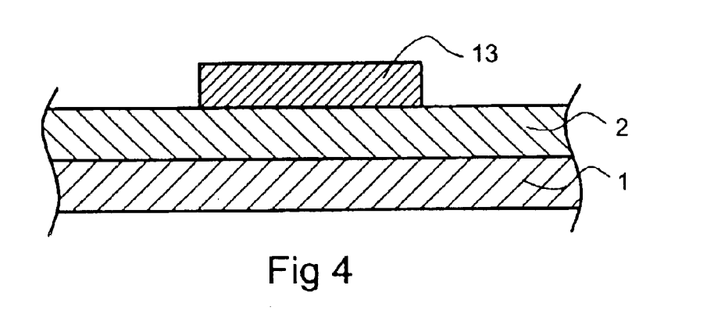
FIG. 4 is a cross-sectional view showing the hard mask after a cleaning process that removes the resist mask, in accordance with an embodiment of the method of the present invention.

FIG. 4 is a cross-sectional view showing the hard mask 13 after an appropriate cleaning process, such as, but not limited to acetone wash, which removes the resist mask 4. The hard mask 13 is exposed and used to define a predetermined portion of the underlying device layer 2.

Figure 5:
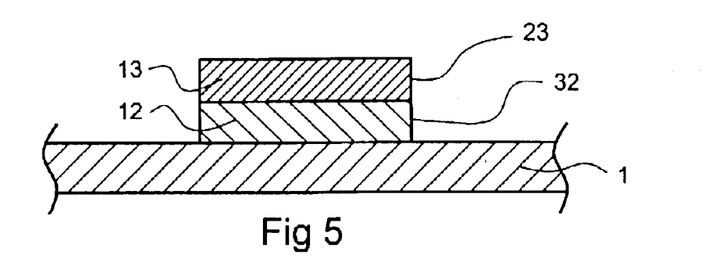
FIG. 5 is a cross-sectional view showing the hard mask and a defined device layer after an etching process that removes portions of the device layer, in accordance with an embodiment of the method of the present invention.

FIG. 5 is a cross-sectional view showing the hard mask 13 and a defined device layer 12 after an appropriate etching process. The hard mask 13 comprises a material resistant to the etching process used to etch the device layer 12 to effectively protect the underlying portion of the device layer 12. The etching process removes portions of the device layer 2 not protected by the hard mask 13. Corresponding portions of the underlying substrate 1 are therefore exposed. An appropriate etching process includes, but is not limited to, an appropriate plasma etching process, also known as dry etching. An appropriate plasma etching process includes, but is not limited to, the well-known CH4+H2+O2 process. Plasma etching is particularly useful for high-resolution material removal to selectively etch only the device layer 2 that is not in the shadow of the hard mask 13. The result is a defined device layer 12 having a well defined device side wall 32 that is substantially coplanar with a hard mask side wall 23.

Figure 6:
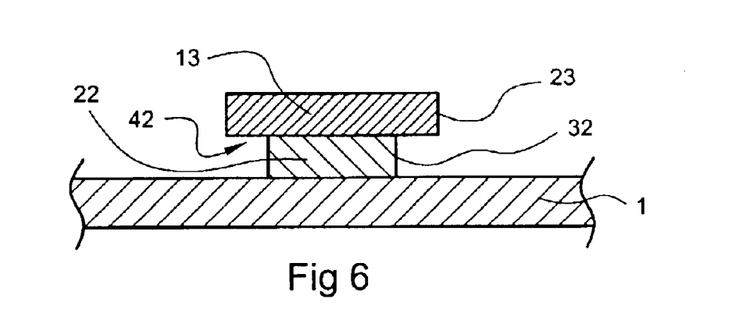
FIG. 6 is a cross-sectional view showing a semiconductor device resulting from wet etching the device side wall to remove device material to form a step interface between the hard mask and the semiconductor device, in accordance with an embodiment of the method of the present invention.

FIG. 6 is a cross-sectional view showing a semiconductor device 22 formed by etching the device side wall 32. An appropriate wet etching process is used to remove device material underlying the perimeter of the hard mask 13 to form a step interface 42 between the hard mask 13 and the semiconductor device 22. Wherein the semiconductor device 22 comprises a compound semiconductor, such as, but not limited to InP, an appropriate wet etching solution includes, but is not limited to, hydrochloric acid (HCl, HCl+H3PO4). The step interface 42 defines a mask overhang or undercut of, for example, but not limited thereto, approximately a few micrometers in width that shadows a portion of the substrate 1 below and about the device side wall 32.

Other embodiments in accordance with the methods of the present invention incorporate a wet etching process rather than plasma etching for producing the defined device layer 12 shown in FIG. 5. A wet etching process is used to remove portions of the device layer 2 from the substrate 1 not protected by the hard mask 13, as well as a portion of the device layer 2 below the perimeter of the hard mask 13, as shown in FIG. 6, defining a device side wall 32 and a step interface 42.

Figure 7:
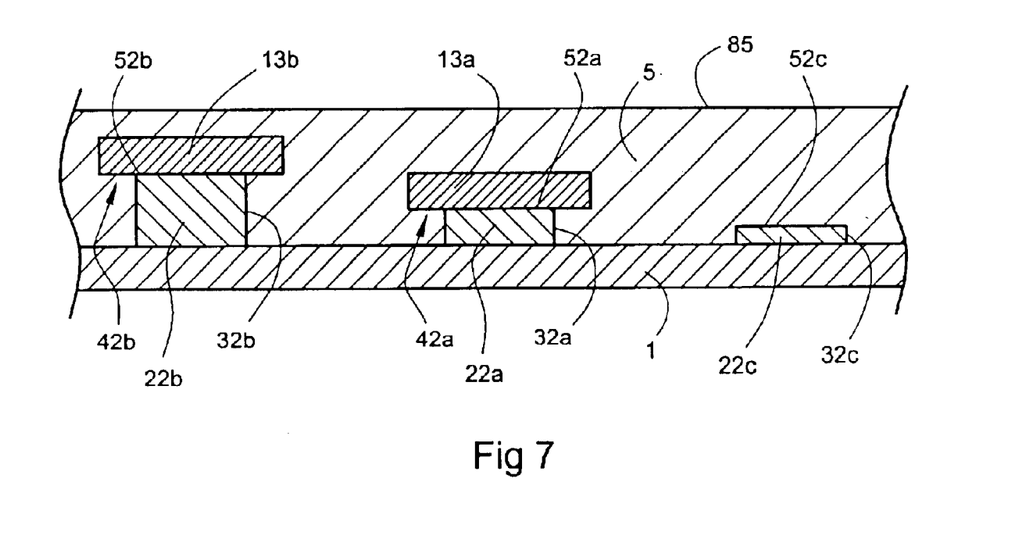
FIG. 7 is a cross-sectional view showing a conforming passivation layer encasing multiple semiconductor devices and extending to at least above the device surface having the highest elevation to the substrate, in accordance with an embodiment of the method of the present invention.

FIG. 7 is a cross-sectional view showing a conforming passivation layer 5 applied to the substrate 1. A first device 22a having a first hard mask 13a, is formed as described above. A second device 22b is shown with a second hard mask 13b as fabricated using a similar process either independently from or simultaneously with the first device 22a. A third device 22c, not having a hard mask, may be formed using, for example, a direct growth process such as an epitaxial method. The first, second, and third devices 22a, 22b, 22c, with corresponding first, second and third device surfaces 52a, 52b, 52c, are shown by way of example as to the application of embodiments of the methods of the present invention applied to multiple devices formed by multiple processes with various device surface elevations.

The passivation layer 5 is applied to encase the first, second, and third devices 22a–c. An applied passivation layer surface 85 extends to a predetermined elevation above the substrate that is at least above the elevation of the second device surface 52b, representing the device surface having the highest elevation above the substrate 1. The passivation layer 5 conforms to the first and second step interfaces 42a, 42b, the first, second and third devices 22a–c, and the region immediately between the first and second hard masks 13a, 13b and the substrate 1. The passivation layer 5 is preselected from materials with appropriate electrical properties and etching characteristics. A suitable material for the passivation layer 5 includes, but is not limited to, Bisbenzocyclotene (BCB) polymer. In one application technique, among others, the passivation material is spun onto the substrate 1 to penetrate under and conform to the first and second step interfaces 42a, 42b, thus sealing and passivating first and second device side walls 32a, 32b of the first and second devices 22a, 22b, respectively. The third device 22c is similarly encased by the passivation layer 5.

Figure 8:
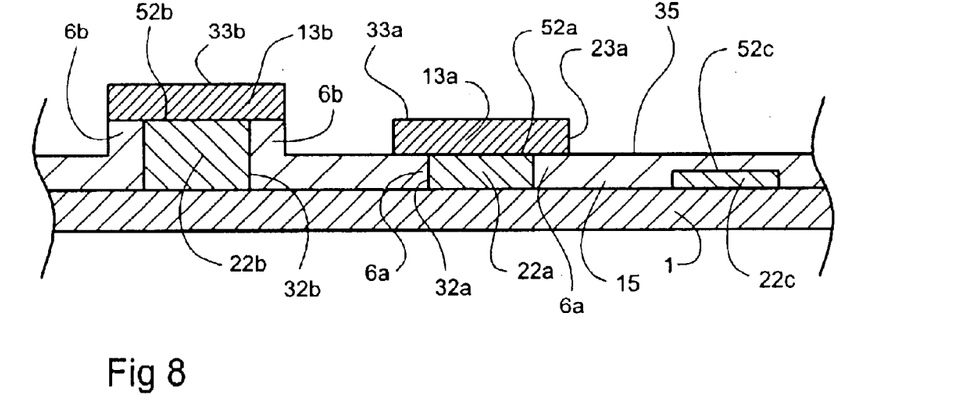
FIG. 8 is a cross-sectional view showing an etched passivation layer at substantially the same elevation as the device surface having an intermediate elevation to the substrate, in accordance with an embodiment of the method of the present invention.

FIG. 8 is a cross-sectional view showing a passivation layer 15 after a suitable etching process, in accordance with an embodiment of the method of the present invention. The etching process produces a passivation layer surface 35 that is at an elevation, from the substrate 1, substantially the same as a first device surface 52a. The first device surface 52a represents a device surface with the lowest elevation that has a hard mask. The first and second hard masks 13a, 13b shield the portion of the passivation layer 15 that is defined by the perimeters of the first and second hard masks 13a, 13b and the substrate 1, adjacent the first and second device side walls 32a, 32b, respectively, from the etching process to form first passivation liner 6a and second passivation liner 6b.

The first and second hard masks 13a, 13b shield the interface between the first and second device side walls 32a,32b and the first and second passivation liners 6a,6b, respectively, from exposure to the etching process, which reduces or eliminates the possibility of trenching along the first and second device side walls 32a,32b. Any microvoids that may be present in the first and second passivation liners 6a,6b and adjacent to the first and second device side walls 32a,32b are not exposed to the etching process and therefore, the potential for etched void enlargement exposing the first and second device side walls 32a,32b is greatly reduced or eliminated. Further, the passivated first and second devices 22a,22b are protected from exposure to the etching process by the first and second hard masks 13a,13b reducing or preventing etch-induced damage.

Figure 9:
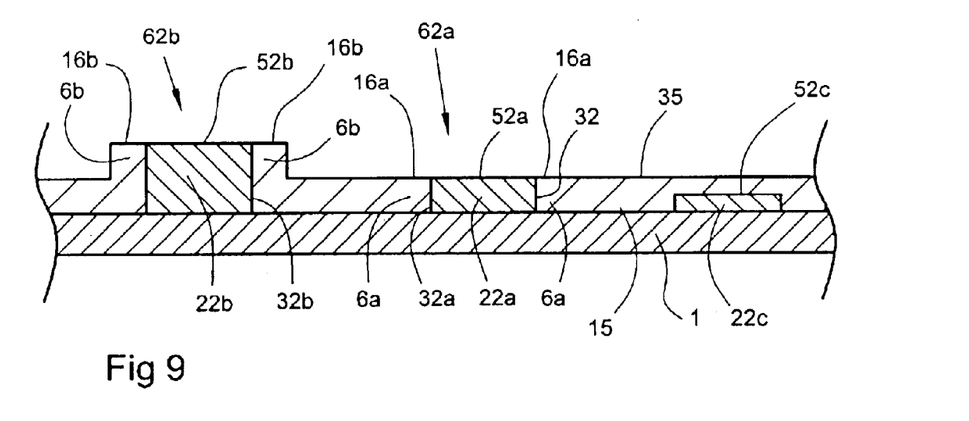
FIG. 9 is a cross-sectional view showing multiple passivated devices after the removal of the hard masks which expose respective device surfaces and coplanar passivation liner surfaces, in accordance with the embodiment of FIG. 8.

FIG. 9 is a cross-sectional view of the substrate 1 of FIG. 8 after the removal of the first and second hard masks 13a,13b which expose the first and second device surfaces 52a,52b, respectively, and respective coplanar first and second passivation liner surfaces 16a,16b, respectively, in accordance with an embodiment of the method of the present invention. The first and second hard masks 13a,13b, each of which originally had conformed to the surface characteristics of the defined device layer 12 prior to the formation of the step interface 42, as shown in FIG. 5, provide a form or mold to which the passivation layer 5 conforms, which imparts a complimentary surface onto the resulting passivation liner surfaces 16a,16b. This provides that the first and second device surfaces 52a,52b and the first and second passivation liner surfaces 16a, 16b defining first and second planarized surfaces 62a,62b, respectively, having a small to zero step height. The second planarized surface 62b is at a higher elevation to the substrate 1 than the passivation layer surface 35, and the first planarized surface 62a is substantially at the same elevation as the passivation layer surface 35. The surface defined by the combination of the first and second planarized surfaces 62a, 62b is referred to as a quasi-planarized surface.

The first and second hard masks 13a,13b minimize the effects of non-uniformity of the passivation layer surface 35 or non-uniformity in the etching process as the first and second planarized surfaces 62a,62b are defined not by the etching processes, but by the first and second hard masks 13a,13b themselves. This allows for a relaxation of processing tolerances and a reduction in defect rate. The first and second hard masks 13a,13b also reduce or eliminate the possibility of residual passivation material remaining on the first and second device surfaces 52a,52b, as they are protected from contact with the passivation material.

The resulting first and second planarized surfaces 62a,62b are particularly suitable for formation of high resolution material layers, such as, but not limited to, a patterned conductive metallized material layer (not shown) that forms electrical interconnects between the semiconducting devices and other electrical components, such as, but not limited to, semiconducting devices and a power supply node. The passivation layer surface 35 can be used, in addition to the first and second planarized surfaces 62a,62b, for lower resolution material layers, such as, but not limited to, metallized bond pads (not shown).

It is appreciated that the elevation from the substrate 1 of the first and second passivation liner surfaces 16a,16b and the first and second device surfaces 52a,52b above the substrate 1 is dependent, in part, on the elevation of the first and second devices 22a,22b.

Figure 10:
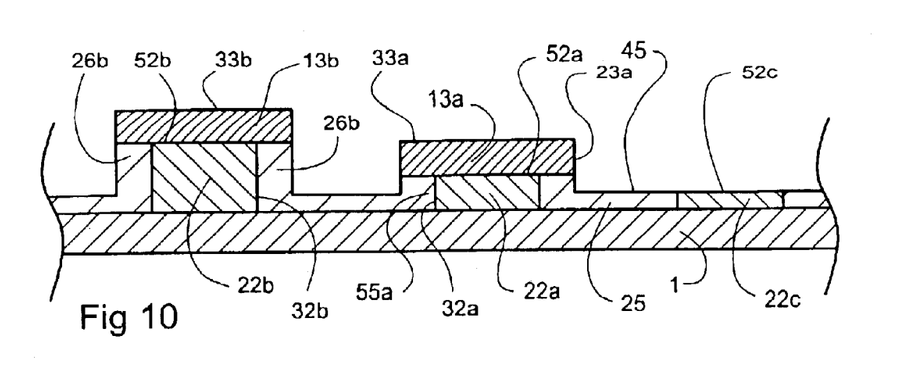
FIG. 10 is a cross-sectional view showing an etched passivation layer that is at substantially the same elevation as the device surface having the lowest elevation to the substrate, in accordance with an embodiment of the method of the present invention.
Figure 11:
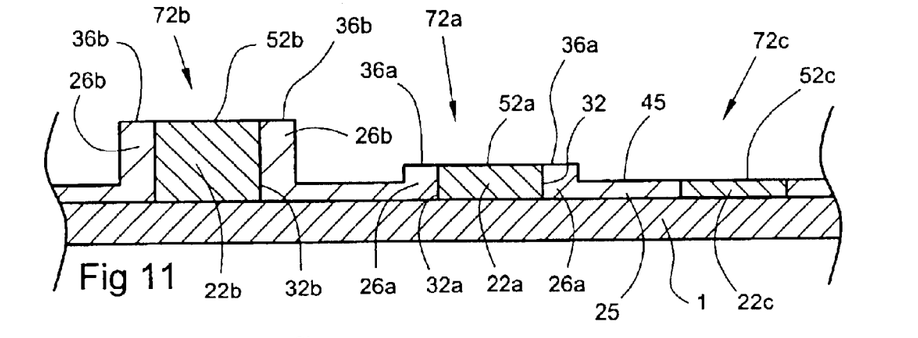
FIG. 11 is a cross-sectional view showing multiple passivated devices after the removal of the hard masks which expose respective device surfaces and coplanar passivation liner surfaces, in accordance with the embodiment of FIG. 10.

FIGS. 10 and 11 illustrate the results of another embodiment in accordance with the methods of the present invention. FIG. 10 is a cross-sectional view showing a passivation layer 25 after a suitable etching process. The etching process produces a passivation layer surface 45 that is at an elevation that is substantially the same as a third device surface 52c. The first and second hard masks 13a,13b shield the portion of the passivation layer 25 that is defined by the perimeters of the first and second hard masks 13a,13b and the substrate 1, adjacent the first and second device side walls 32a,32b, from the etching process to form first and second passivation liners 26a,26b, in much the same way as discussed above for FIG. 8.

FIG. 11 is a cross-sectional view after the removal of the first and second hard masks 13a,13b which expose the first and second device surfaces 52a,52b, respectively, and a coplanar first and second passivation liner surfaces 36a,36b, respectively, in much the same way as discussed above for FIG. 9. In this embodiment, the first and second planarized surfaces 72a,72b extend at a higher elevation to the substrate 1 than the passivation layer surface 45, and the third planarized surface 72c is substantially at the same elevation as the passivation layer surface 45.

Figure 12:
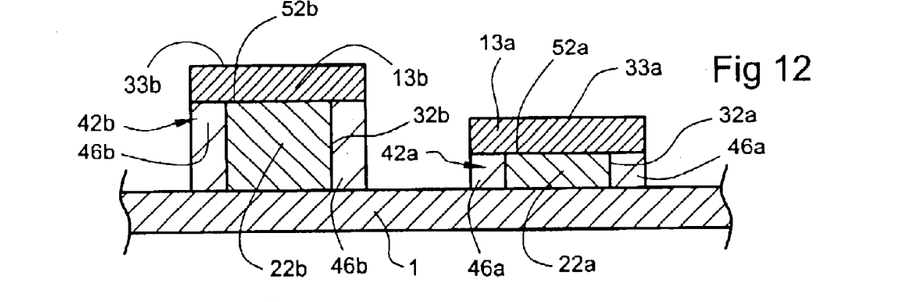
FIG. 12 is a cross-sectional view showing multiple passivated devices after an etching process to remove the exposed passivation layer, in accordance with an embodiment of the method of the present invention.
Figure 13:
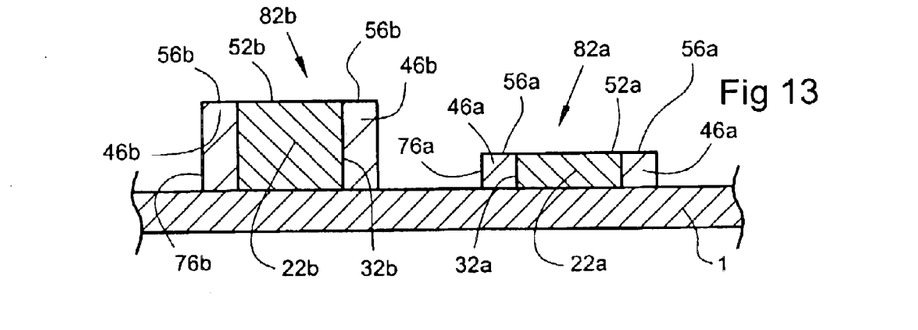
FIG. 13 is a cross-sectional view showing multiple passivated devices after the removal of the hard masks which exposes respective device surfaces and coplanar passivation liner surfaces, in accordance with the embodiment of FIG. 12.

FIGS. 12 and 13 illustrate the results of another embodiment in accordance with the methods of the present invention. FIG. 12 is a cross-sectional view of passivated first and second devices 22a,22b after an etching process is used to remove the portion of the passivation layer 5, as shown in FIG. 7, that is not shielded by the first and second hard masks 13a,13b. First and second passivation liners 46a,46b are formed, defined by the perimeters of the first and second hard masks 13a,13b, adjacent the first and second device side walls 32a,32b.

FIG. 13 is a cross-sectional view after the removal of the first and second hard masks 13a, 13b which expose the first and second device surfaces 52a,52b and coplanar first and second passivation liner surfaces 56a,56b, respectively, defining first and second planarized surfaces 82a,82b which have a small to zero step height. The first and second devices 22a,22b and respective passivation liners 46a,46b extend as columns from the substrate 1. The column form is particularly useful for subsequent processes suitable for a particular purpose. In accordance with an embodiment of the present invention, a metallization layer (not shown) is applied to the first and second liner side walls 76a,76b to provide a specific structure, such as, but not limit thereto, plated interlayer interconnects, that provide electrical interconnection between a metallization layer on the first and second passivation liner surfaces 56a,56b and the substrate 1.

Figure 14:
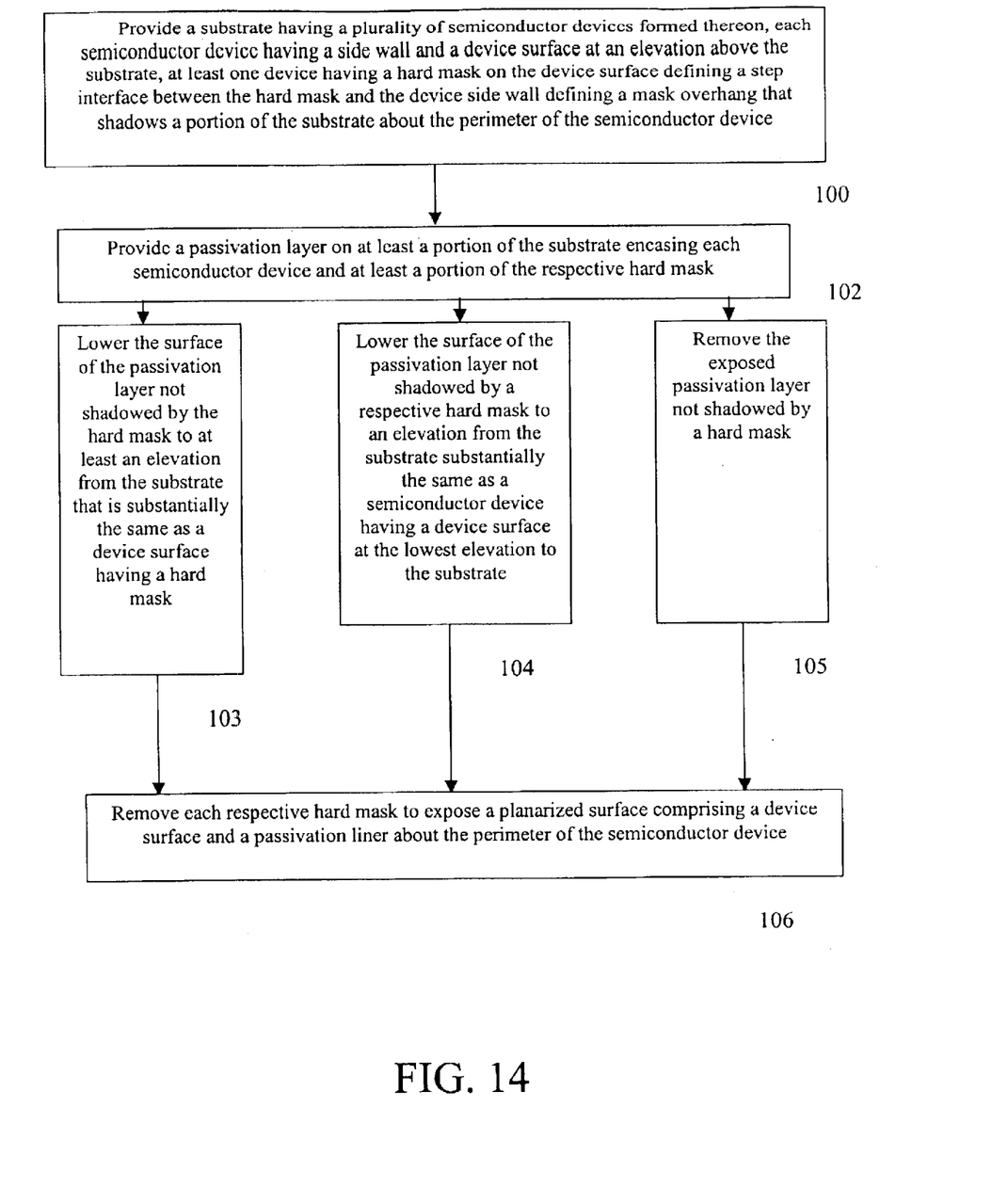
FIG. 14 is a flow chart of selected embodiments of methods in accordance with the present invention.

FIG. 14 is a flow diagram of embodiments in accordance with methods of the present invention. One embodiment in accordance with a method of the present invention comprises: providing a substrate having a plurality of semiconductor devices formed thereon, each semiconductor device having a side wall and a device surface at an elevation above the substrate, at least one device having a hard mask thereon defining a step interface between the hard mask and the device side wall defining a mask overhang that shadows a portion of the substrate about the perimeter of the semiconductor device 100; providing a passivation layer on at least a portion of the substrate encasing each semiconductor device and at least a portion of the respective hard mask 102; lowering the surface of the passivation layer not shadowed by the hard mask at least to an elevation from the substrate that is substantially the same as a device surface having a hard mask 103; and removing respective hard masks to expose a planarized surface comprising a device surface and a passivation liner about the perimeter of the semiconductor device 106.

In another embodiment in accordance with the methods of the present invention comprises essentially of the same methods as provided by the method immediately above, providing lowering the surface of the passivation layer not shadowed by the hard mask to an elevation from the substrate substantially the same as a device surface of a semiconductor device at the lowest elevation to the substrate 104.

In another embodiment in accordance with the methods of the present invention comprises essentially of the same methods as provided by the method immediately above, providing removing the exposed passivation layer not shadowed by a hard mask 105.

Figure 15:
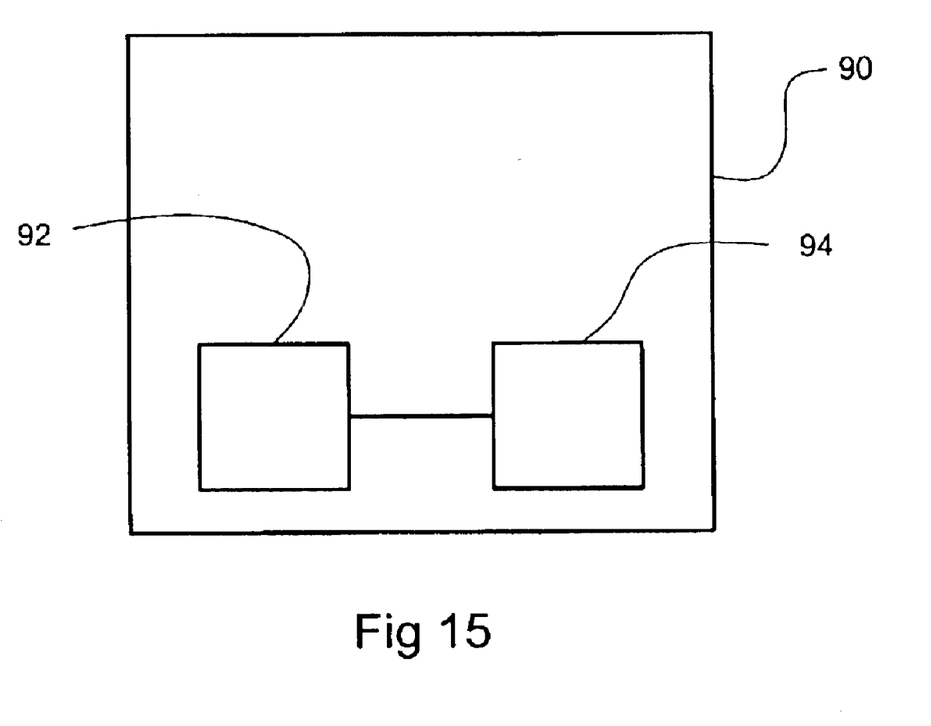
FIG. 15 is a representation of an electronic assembly comprising a semiconductor device made in accordance with an embodiment of the methods of the present invention.

FIG. 15 is a top view of an assembly 90 comprising a plurality of interconnected components 92, 94 wherein at least one component 92 comprises a semiconductor device fabricated in accordance with an embodiment of the methods of the present invention. The semiconductor device is tested, separated, packaged, incorporated into the component 92, and integrated into the assembly 90. Examples of assemblies 90 include, but not limited to, cell phones, networking systems, high brightness (HB) light emitting diodes (LEDs), laser diodes (LDs), photodiodes, modulator diodes, and multijunction solar cells.

Methods in accordance with the present invention can be used to fabricate many types of semiconductor devices, such as, but not limited to, heterobiopolar transistors (HBT) and high electron mobility transistors (HEMT) that are prevalent in cordless portable telephones, cell phones, as well as other communication devices.

Methods in accordance with the present invention can be used to fabricate semiconductor devices based on a variety of semiconducting materials suitable for many applications. For example, but not limited thereto, Indium Phosphide (InP)-based semiconductor devices are desirable for communication networks as InP devices have the ability to provide functional reliably and high speed operation useful for broadband fiberoptic and wireless components.

Gallium Nitride-based semiconductor devices are desirable for HB-LEDs and laser diodes in the blues spectrum, as well as memory devices due to GaN's ability to compactly store data and information. Gallium Arsenide Monolithic Microwave Integrated Circuit (GaAs MMIC)-based devices have the ability to deliver a wide range of wavelengths, such as those associated with television satellite transmissions transmitted anywhere on earth that has a satellite dish with MMIC devices.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for fabricating a semiconductor component, comprising:

providing a substrate having a plurality of semiconductor devices formed thereon, each semiconductor device having a side wall and a device surface at an elevation above the substrate, at least one device having a hard mask on the device surface defining a step interface between the hard mask and the device side wall defining a mask overhang that shadows a portion of the substrate about the perimeter of the semiconductor device;

providing a passivation layer on at least a portion of the substrate encasing each semiconductor device and at least a portion of each respective hard mask;

lowering the surface of the passivation layer not shadowed by the hard mask at least to an elevation from the substrate that is substantially even with a device surface having a hard mask; and removing each hard mask to expose a planarized surface comprising a semiconductor device and a passivation liner about the perimeter of the semiconductor device.

2. The method of claim 1, wherein providing a substrate having a plurality of semiconductor devices formed thereon, each semiconductor device having a side wall and a device surface at an elevation above the substrate, at least one device having a hard mask on the device surface defining a step interface between the hard mask and the device side wall defining a mask overhang that shadows a portion of the substrate about the perimeter of the semiconductor device comprises:

forming a device layer on a substrate;

forming a hard mask layer on the device layer;

forming a resist mask on the hard mask layer;

removing the hard mask layer from the device layer not covered by the resist layer to form a plurality of hard masks;

removing the resist mask;

removing the device layer from the substrate not covered by the plurality of hard masks; and removing a portion of the device layer between the plurality of hard masks and the substrate about a perimeter of each hard mask defining a step interface between the device layer and each hard mask.

3. The method of claim 1, wherein lowering the surface of the passivation layer not shadowed by the hard mask at least to an elevation from the substrate that is substantially even with a device surface having a hard mask comprises lowering the surface of the passivation layer not shadowed by a hard mask to a level substantially flush with a device surface of a semiconductor device wherein the device surface is at the lowest elevation to the substrate.

4. The method of claim 1, wherein lowering the surface of the passivation layer not shadowed by the hard mask at least to an elevation from the substrate that is substantially even with a device surface having a hard mask comprises removing the exposed passivation layer not shadowed by a hard mask.

5. The method of claim 1, wherein providing a substrate having a plurality of semiconductor devices formed thereon, each semiconductor device having a side wall and a device surface at an elevation above the substrate, at least one device having a hard mask on the device surface defining a step interface between the hard mask and the device side wall defining a mask overhang that shadows a portion of the substrate about the perimeter of the semiconductor device comprises:

providing a substrate having a plurality of semiconductor devices formed thereon, each semiconductor device having a side wall and a device surface at an elevation-above the substrate, at least one device having a hard mask on the device surface defining a step interface between the hard mask and the device side wall defining a mask overhang that shadows a portion of the substrate about the perimeter of the semiconductor device, the hard mask layer comprising a material selected from the group consisting of silicon dioxide and silicon nitride.

6. The method of claim 1, wherein providing a passivation layer on at least a portion of the substrate encasing each semiconductor device and at least a portion of the respective hard mask comprises providing a polymer layer on at least a portion of the substrate encasing each semiconductor device and at least a portion of the hard mask.

7. A method for fabricating microelectronic components, comprising:
   forming a device layer on a substrate surface of a substrate, the device layer having a device surface at an elevation to the substrate surface;
   forming a hard mask layer on the device layer;
   forming a resist mask on the hard mask layer;
   removing the hard mask layer from the device layer not covered by the resist layer to form a hard mask;
   removing the resist mask;
   removing the device layer from the substrate not covered by the hard mask;
   removing a portion of the device layer between the hard mask and the substrate about a perimeter of the hard mask defining a step between the device layer and the hard mask;
   covering the device layer and at least a portion of the hard mask and at least a portion of the substrate adjacent the device layer with a passivation layer;
   lowering a surface of the passivation layer not shadowed by the hard mask at least to an elevation from the substrate that is substantially even with a device surface having a hard mask; and
   removing the hard mask.

8. The method of claim 7, wherein removing the device layer from the substrate not covered by the hard mask comprises removing the device layer from the substrate not covered by the hard mask using a dry etching process; and
   wherein removing a portion of the device layer between the hard mask and the substrate about a perimeter of the hard mask comprises removing a portion of the device layer between the hard mask and the substrate about a perimeter of the hard mask using a wet etching process.

9. The method of claim 7, wherein removing the device layer from the substrate not covered by the hard mask and removing a portion of the device layer between the hard mask and the substrate about a perimeter of the hard mask comprises:
   removing the device layer from the substrate not covered by the hard mask and removing a portion of the device layer between the hard mask and the substrate about a perimeter of the hard mask using a wet etching process layer.

10. The method of claim 7, wherein lowering a surface of the passivation layer not shadowed by the hard mask at least to an elevation from the substrate that is substantially even with a device surface having a hard mask comprises:
   lowering a surface of the passivation layer not shadowed by the hard mask at least to an elevation from the substrate-that is substantially even with a device surface having a hard mask that is at the lowest elevation to the substrate surface.

11. The method of claim 7, wherein lowering a surface of the passivation layer not shadowed by the hard mask at least to an elevation from the substrate that is substantially even with a device surface having a hard mask comprises:
   lowering a surface of the passivation layer not shadowed by the hard mask at least to an elevation from the substrate that is substantially flush with a semiconductor device having a device surface that is at the lowest elevation to the substrate surface.

12. The method of claim 7, wherein lowering a surface of the passivation layer not shadowed by the hard mask at least to an elevation from the substrate that is substantially even with a device surface having a hard mask comprises removing the exposed passivation layer not shadowed by a hard mask.

13. The method of claim 7, wherein forming a hard mask layer on the device layer comprises forming a hard mask layer on the device layer, the hard mask layer comprising a material selected from the group consisting of silicon dioxide and silicon nitride.

14. The method of claim 7, wherein forming a device layer on a surface of the substrate comprises forming a semiconducting layer on a surface of the substrate.

15. The method of claim 7, wherein covering the device layer and at least a portion of the hard mask and at least a portion of the substrate adjacent the device layer with a passivation layer comprises covering the device layer and at least a portion of the hard mask and at least a portion of the substrate adjacent the device layer with a polymer layer, the polymer layer conforming to the step between the device layer and the hard mask.

16. A method for fabricating an assembly, comprising:
   interconnecting a plurality of components wherein at least one component comprises a semiconductor device, the semiconductor device fabricated using a method comprising:
   providing a substrate having a plurality of semiconductor devices formed thereon, each semiconductor device having a side wall and a device surface at an elevation above the substrate, at least one device having a hard mask on the device surface defining a step interface between the hard mask and the device side wall defining a mask overhang that shadows a portion of the substrate about the perimeter of the semiconductor device;
   providing a passivation layer on at least a portion of the substrate encasing each semiconductor device and at least a portion of the respective hard mask;
   lowering a surface of the passivation layer not shadowed by the hard mask at least to an elevation from the substrate that is substantially even with a device surface having a hard mask; and
   removing each respective hard mask to expose a planarized surface comprising a semiconductor device and a passivation liner about the perimeter of the semiconductor device.

17. The method of claim 16, wherein lowering a surface of the passivation layer not shadowed by the hard mask at least to an elevation from the substrate that is substantially even with a device surface having a hard mask comprises:
   lowering the surface of the passivation layer not shadowed by a respective hard mask to a level substantially flush with a device surface of a semiconductor device wherein the device surface is at the lowest elevation to the substrate.

18. The method of claim 16, wherein lowering a surface of the passivation layer not shadowed by the hard mask at least to an elevation from the substrate that is substantially even with a device surface having a hard mask comprises removing the exposed passivation layer not shadowed by a hard mask.

19. The method of claim 16, wherein
providing a substrate having a plurality of semiconductor devices formed thereon, each semiconductor device having a side wall and a device surface at an elevation above the substrate, at least one device having a hard mask on the device surface defining a step interface between the hard mask and the device side wall defining a mask overhang that shadows a portion of the substrate about the perimeter of the semiconductor device comprises:
providing a substrate having a plurality of semiconductor devices formed thereon, each semiconductor device having a side wall and a device surface at an elevation above the substrate, at least one device having a hard mask on the device surface defining a step interface between the hard mask and the device side wall defining a mask overhang that shadows a portion of the substrate about the perimeter of the semiconductor device, the hard mask layer comprising a material selected from the group consisting of silicon dioxide and silicon nitride.

20. The method of claim 16 wherein providing a passivation layer on at least a portion of the substrate encasing each semiconductor device and at least a portion of the respective hard mask comprises providing a polymer layer on at least a portion of the substrate encasing each semiconductor device and at least a portion of the respective hard mask.

* * * * *

UNITED STATES PATENT AND TRADEMARK OFFICE
CERTIFICATE OF CORRECTION

PATENT NO. : 6,846,740 B2
DATED : January 25, 2005
INVENTOR(S) : Demir et al.

It is certified that error appears in the above-identified patent and that said Letters Patent is hereby corrected as shown below:

Column 10,
Line 67, "...at an elevation-" should read -- ...at an elevation --; and Column 11,
Line 65, "substrate-that is..." should read -- substrate that is... --.

Signed and Sealed this

Seventh Day of February, 2006

JON W. DUDAS
*Director of the United States Patent and Trademark Office*